United States Patent [19]
Goenka

[11] Patent Number: 5,928,434
[45] Date of Patent: Jul. 27, 1999

[54] METHOD OF MITIGATING ELECTROSTATIC CHARGE DURING CLEANING OF ELECTRONIC CIRCUIT BOARDS

[75] Inventor: Lakhi Nandlal Goenka, Ann Arbor, Mich.

[73] Assignee: Ford Motor Company, Dearborn, Mich.

[21] Appl. No.: 09/113,027

[22] Filed: Jul. 13, 1998

[51] Int. Cl.⁶ ........................................ B08B 5/00
[52] U.S. Cl. .................. 134/2; 134/6; 134/7; 134/26; 134/30; 134/10; 134/31; 134/36; 134/37; 134/40; 134/72; 134/902; 451/38; 451/39; 451/75; 451/78; 451/90; 451/102
[58] Field of Search ...................... 134/2, 6, 7, 26, 134/72, 902, 10, 30, 31, 36, 37, 40; 451/38, 39, 75, 78, 90, 102

[56] References Cited

U.S. PATENT DOCUMENTS

| | | | |
|---|---|---|---|
| 4,132,567 | 1/1979 | Blackwood | 134/1 |
| 4,569,695 | 2/1986 | Yamashita et al. | 134/1 |
| 4,974,375 | 12/1990 | Tada et al. | 51/413 |
| 5,354,384 | 10/1994 | Sneed et al. | 134/6 |
| 5,364,472 | 11/1994 | Heyns et al. | 134/7 |
| 5,405,283 | 4/1995 | Goenka . | |
| 5,409,418 | 4/1995 | Krone-Schmidt et al. | 451/75 |
| 5,421,766 | 6/1995 | Shank, Jr. | 451/75 |
| 5,447,577 | 9/1995 | Gao et al. | 148/23 |
| 5,514,024 | 5/1996 | Goenka . | |
| 5,545,073 | 8/1996 | Kneisel et al. | 451/39 |
| 5,616,067 | 4/1997 | Goenka . | |
| 5,651,834 | 7/1997 | Jon et al. . | |
| 5,679,062 | 10/1997 | Goenka | 451/75 |

*Primary Examiner*—Lyle A. Alexander
*Assistant Examiner*—S. Carrillo
*Attorney, Agent, or Firm*—Leslie C. Hodges; Roger L. May

[57] ABSTRACT

A method is provided for cleaning an electronic circuit board having first and second opposing surfaces. The method includes directing a stream of carbon dioxide particles against the first surface. Steam is sprayed toward the first and second surfaces such that condensation of the steam caused by cooling from the $CO_2$ particles forms a thin film of water on the first surface for conducting electrostatic charge away from the first surface. The $CO_2$ particles substantially remove residue present on the first surface, thereby cleaning the circuit board.

8 Claims, 1 Drawing Sheet

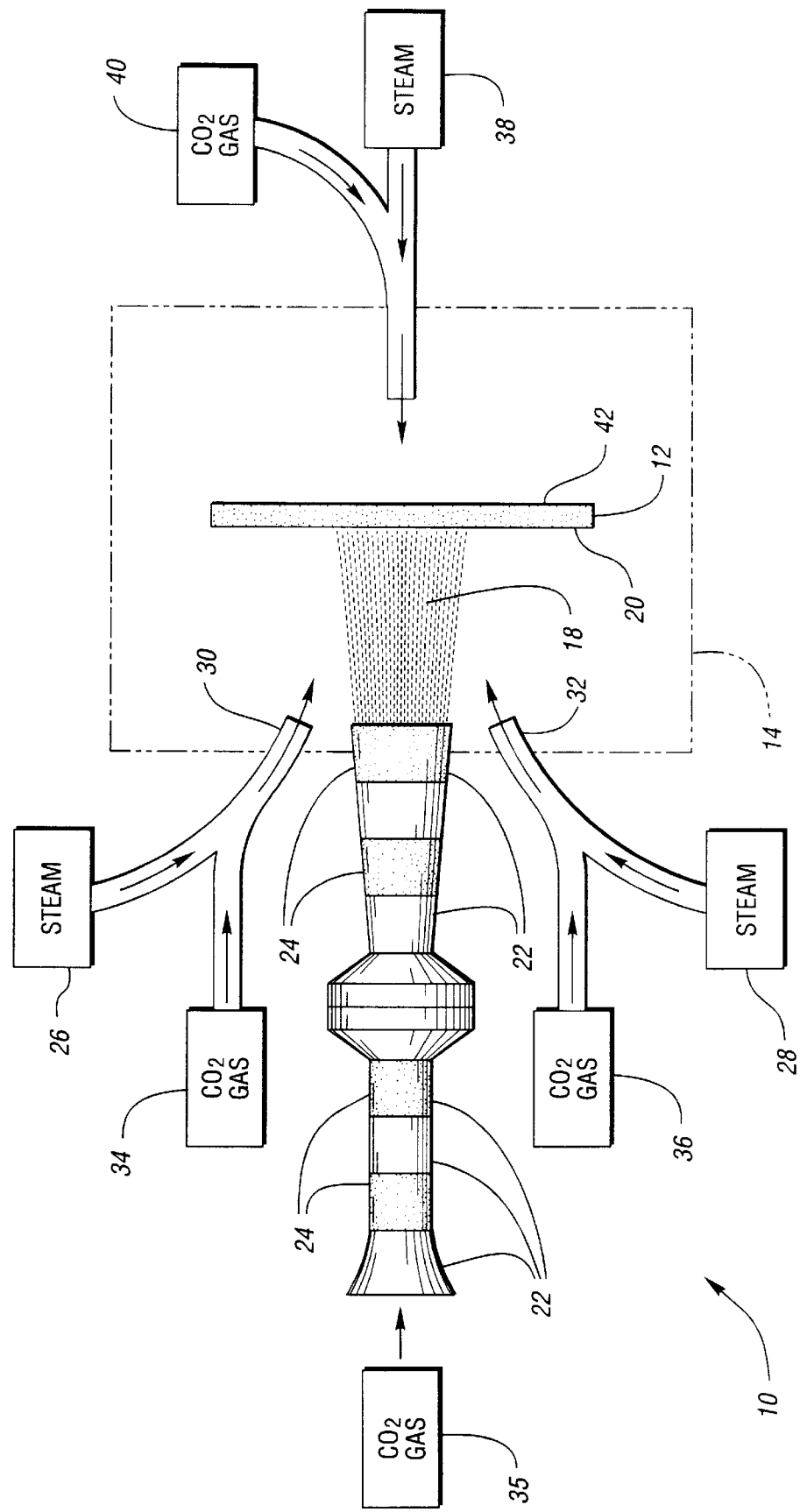

METHOD OF MITIGATING ELECTROSTATIC CHARGE DURING CLEANING OF ELECTRONIC CIRCUIT BOARDS

TECHNICAL FIELD

The present invention relates to a method of cleaning an object such as an electronic circuit board, and more particularly to a method of mitigating electrostatic charge during $CO_2$ cleaning by spraying steam toward the surface to be cleaned, wherein condensation of the steam forms a thin film of water on the surface for conducting electrostatic charge away from the surface.

BACKGROUND OF THE INVENTION

After components are soldered to a circuit board, the board undergoes a cleaning operation to remove any residues that remain following soldering. Circuit boards are usually cleaned by washing them with a solvent capable of dissolving the undesirable residues. While solvent washing is an effective cleaning method, disposing of the spent solvent in an environmentally correct manner often imposes severe constraints. For that reason, cleaning a circuit board with solid carbon dioxide ($CO_2$) particles has become very attractive.

To clean a circuit board with solid $CO_2$ particles, the particles, either in the form of pellets or snow, are directed at the surface of the board. Upon contact, the $CO_2$ particles sublimate, effectively removing the residues on the board. Thus, the board surface is generally left clean and residue-free. The waste stream resulting from $CO_2$ cleaning consists essentially of the residues removed from the board, imposing less environmental constraints than conventional solvent cleaning.

Despite the advantage of reduced environmental impact, $CO_2$ cleaning is not without its drawbacks. In particular, $CO_2$ cleaning usually results in electrostatic discharge (ESD), which is a serious problem. When solid $CO_2$ particles, which are cold and dry, strike the board surface, the particles tribocharge the circuit board. The level of charge on the circuit board can become high enough to breakdown the air surrounding the board, thereby creating ESD events. Certain electronic components are very sensitive to ESD events, and therefore may not be cleaned by $CO_2$.

There are two possible approaches to reducing the ESD associated with $CO_2$ cleaning. One possible approach is to reduce or eliminate tribocharging of the board. In practice, reducing tribocharging has not proved feasible. The other approach is to mitigate ESD during $CO_2$ cleaning. One conventional method of mitigating ESD is to dissipate the charge generated during tribocharging by grounding the conductive areas on the circuit board. Unfortunately, charge may also build up on the non-conductive surfaces of the circuit board during $CO_2$ cleaning. Such surfaces, by their very nature, cannot be grounded. Thus, grounding, by itself, will not reduce ESD below a level at which a circuit board containing ESD-sensitive components can be safely cleaned. Additionally, grounding the conductive areas on each circuit board is not practical for most in-line cleaning processes.

Another approach to mitigating ESD generated during $CO_2$ cleaning is to spray the circuit board with a water mist to coat the surface with a film of water. The water film acts to dissipate charges built up during $CO_2$ cleaning.

U.S. Pat. No. 5,651,834 to Lucent Technologies suggests spraying a water mist at the cleaning surface and at the $CO_2$ snow stream. However, the water tends to freeze on contact with the cold $CO_2$ stream thereby reducing its effectiveness in conducting the charge, as well as impeding the cleaning action of the $CO_2$ stream. Another drawback of this technique is that an electrostatic charge is generated on the water particles as they are being atomized in spray nozzles, which counteracts the electrostatic charge dissipation.

Thus, there is a need for a technique for cleaning a circuit board with $CO_2$ that mitigates ESD to sufficiently low levels acceptable for ESD-sensitive components.

DISCLOSURE OF THE INVENTION

The present invention overcomes the above-referenced shortcomings of prior art methods by providing a method of cleaning an electronic circuit board using a stream of carbon dioxide particles, wherein steam is sprayed toward the surface to be cleaned, and condensation of the steam caused by cooling from the $CO_2$ particles forms a thin film of water on the surface for conducting electrostatic charges away from the surface.

More specifically, the present invention provides a method of cleaning an electronic circuit board having first and second opposing surfaces. The method includes the steps of: a) directing a stream of carbon dioxide ($CO_2$) particles against the first surface; and b) spraying steam toward the first surface such that condensation of the steam caused by cooling from the $CO_2$ particles forms a thin film of water on the first surface for conducting electrostatic charge away from the first surface, wherein the $CO_2$ particles substantially remove residue present on the first surface, thereby cleaning the circuit board.

In a preferred embodiment, the steam is also sprayed on the second surface of the electronic circuit board, and the steam is sprayed at opposing sides of the carbon dioxide stream adjacent the first surface. The sprayed steam may be driven with $CO_2$ vapor. This forms carbonic acid upon condensation on the circuit board, which considerably increases the conductivity of the water film.

Also, the circuit board is grounded and shunted. Additionally, steam may be introduced into the cleaning chamber to increase the humidity within the chamber. Also, the $CO_2$ particles may be sprayed through a nozzle having sequentially alternating conductive and insulative transverse strips along the length thereof to minimize electric charge build up on the $CO_2$ particles being sprayed.

Accordingly, an object of the invention is to provide a technique for cleaning a circuit board with $CO_2$ snow in which electrostatic discharge is mitigated.

The above object and other objects, features, and advantages of the present invention are readily apparent from the following detailed description of the best mode for carrying out the invention when taken in connection with the accompanying drawings.

BRIEF DESCRIPTION OF THE DRAWING

The FIGURE shows a schematically arranged plan view of an electronic circuit board cleaning system in accordance with the present invention.

DETAILED DESCRIPTION OF THE PREFERRED EMBODIMENT

Referring to FIG. 1, an electronic circuit board cleaning system 10 is shown schematically in accordance with the present invention. As shown, an electronic circuit board 12 is conveyed through a cleaning chamber 14 to be subjected to the method of cleaning described herein.

A nozzle 16 is positioned within the chamber 14 for spraying carbon dioxide ($CO_2$) snow 18 from the $CO_2$ gas source 35 against the first surface 20 of the electronic circuit board 12. Alternatively, liquid $CO_2$ and air could be injected into the nozzle 16. The nozzle 16 may include a plurality of sequentially alternating conductive and insulative transverse strips 22,24, such as metal and plastic respectively, along the length of the nozzle 16 to minimize electric charge build up in the $CO_2$ particles 18 being sprayed. The alternating conductive/insulative strips 22,24 are operative to generate opposing triboelectric charges on the solid $CO_2$ particles, which counteracts the charge build-up.

Also, the nozzle 16 itself is grounded. Sources of steam 26,28 are provided on opposing sides of the stream of $CO_2$ snow 18. The steam from the sources 26,28 are directed through orifices 30,32 by means of pressurized $CO_2$ gas sources 34,36. The $CO_2$ gas sources 34,36 force the steam toward the stream of $CO_2$ snow 18 as the electronic circuit board 12 is being cleaned. The steam is cooled by the $CO_2$ snow and condenses on the surface to form a thin film of water which then acts to conduct away the electrostatic charge from the surface 20. Condensation of steam results from cooling provided by the $CO_2$ snow 18. The latent heat of the steam minimizes the icing of the condensed water on the target surface 20.

Another advantage of using steam instead of water is that electrostatic charge, which would be generated on the water particles as they are being atomized in spray nozzles (gas-assisted atomization nozzles), does not occur in the steam because the steam jets out under pressure through the orifices 30,32, and no electrostatic charge is built up.

Preferably, an additional source of steam 38 and pressurized $CO_2$ gas source 40 are provided for blowing steam against the second surface 42 of the electronic circuit board 12. Also, the electronic circuit board 12 is shunted and grounded, and additional steam is introduced into the cleaning chamber 14 to increase the humidity within the chamber.

A test was performed using a silicon micromachined $CO_2$ nozzle to generate the $CO_2$ snow for cleaning. The steam was introduced at a pressure of 60–80 psi, and discharged through a 1/8 inch diameter orifice. No signs of ice build up on the board being cleaned were observed. In fact, in regions where the nozzle would normally have built up ice from atmospheric condensation, the steam actually helped dissipate the ice into water. Ice build up would result in failure to properly clean the part. The absence of ice is due to the latent heat of vaporization of the steam, which is released when the steam condenses to water.

When the steam is mixed with a stream of $CO_2$ gas, carbonic acid forms when the mixture is condensed onto the surface of the part being cleaned. This carbonic acid acts to increase the conductivity of the condensed water film to enhance charge dissipation.

Another advantage of this method is that the steam nozzles do not have to be as carefully directed as is the case with the use of water nozzles. It is conceivable that the steam may enshroud the whole working area during the cleaning operation, thereby completely mitigating the ESD.

The pressure of the steam can vary from a few psi gauge to hundreds of psi, although a pressure of 5–80 psig is preferred. A higher pressure results in higher temperature of the steam, a larger mass flow of the steam, as well as greater discharge velocities for a given orifice discharge area. Additionally, multiple steam orifices located upstream and downstream of the cleaning nozzle, as well as on the backside of the part being cleaned, may be used.

While the best mode for carrying out the invention has been described in detail, those familiar with the art to which this invention relates will recognize various alternative designs and embodiments for practicing the invention within the scope of the appended claims.

What is claimed is:

1. A method of cleaning an electronic circuit board having first and second opposing surfaces, comprising:

a) directing a stream of carbon dioxide ($CO_2$) particles against the first surface;

b) spraying steam towards the first surface;

c) condensing the steam by cooling said steam with the $CO_2$ particles present on said first surface, wherein said steam forms a film of water on said first surface such that latent heat from said steam prevents icing of said film of water;

d) removing residue present on the first surface by said $CO_2$ particles, thereby cleaning the electronic circuit board.

2. The method of claim 1, further comprising spraying steam toward the second surface such that condensation of the steam forms a film of water on the second surface.

3. The method of claim 1, wherein said steps of spraying steam toward the first surface comprises spraying steam at opposing sides of said stream of carbon dioxide.

4. The method of claim 1, wherein said step of spraying steam comprises driving the steam with a $CO_2$ vapor.

5. The method of claim 1, further comprising grounding and shunting the electronic circuit board.

6. The method of claim 1, further comprising placing the electronic circuit board in a cleaning chamber and introducing steam into the cleaning chamber to increase humidity within the chamber.

7. The method of claim 1, wherein said step of directing a stream of $CO_2$ particles comprises directing the stream through a nozzle having sequentially alternating conductive and insulative transverse strips along a length of the nozzle to minimize electric charge build up in the $CO_2$ particles being sprayed.

8. A method of cleaning an object having first and second opposing surfaces, comprising:

a) directing a stream of carbon dioxide ($CO_2$) particles against the first surface;

b) spraying steam towards the first surface;

c) condensing the steam by cooling said steam with the $CO_2$ particles present on said first surface, wherein said steam forms a film of water on said first surface such that latent heat from said steam prevents icing of said film of water;

d) removing residue present on the first surface by said $CO_2$ particles, thereby cleaning the object.

* * * * *